United States Patent
Meng et al.

(10) Patent No.: US 8,162,628 B2
(45) Date of Patent: Apr. 24, 2012

(54) WIRING STRUCTURE FOR USE IN MICRO PIEZOELECTRIC PUMP

(75) Inventors: Hsien-Kai Meng, Taoyuan Hsien (TW); Shu-Pin Hsieh, Taoyuan Hsien (TW); Chieh-Ming Hsiung, Taoyuan Hsien (TW); Chien-Hua Lin, Taoyuan Hsien (TW); Yu-Chung Hsu, Taoyuan Hsien (TW); Tai-Shuan Lin, Taoyuan Hsien (TW)

(73) Assignee: Microbase Technology Corp., Taoyuan Hsien (TW)

( * ) Notice: Subject to any disclaimer, the term of this patent is extended or adjusted under 35 U.S.C. 154(b) by 769 days.

(21) Appl. No.: 12/330,367

(22) Filed: Dec. 8, 2008

(65) Prior Publication Data

US 2010/0068080 A1    Mar. 18, 2010

(30) Foreign Application Priority Data

Sep. 15, 2008 (TW) ................................ 97135312 A

(51) Int. Cl.
*F04B 17/00* (2006.01)

(52) U.S. Cl. .................. 417/413.2; 417/413.1; 310/311; 310/314; 310/317; 310/328; 310/348; 310/353; 310/365

(58) Field of Classification Search .............. 417/413.1, 417/413.2; 310/311, 314, 317, 328, 348, 310/353, 365
See application file for complete search history.

(56) References Cited

U.S. PATENT DOCUMENTS

| | | | | |
|---|---|---|---|---|
| 2,824,219 A | * | 2/1958 | Fisher et al. | 310/312 |
| 3,107,630 A | * | 10/1963 | Johnson et al. | 417/322 |
| 3,622,816 A | * | 11/1971 | McGrew | 310/312 |
| 3,723,920 A | * | 3/1973 | Sheahan et al. | 333/189 |
| 4,431,937 A | * | 2/1984 | White | 310/344 |
| 4,939,405 A | * | 7/1990 | Okuyama et al. | 310/330 |
| 5,430,345 A | * | 7/1995 | Takahashi | 310/348 |
| 6,104,127 A | * | 8/2000 | Kameyama et al. | 310/346 |
| 6,124,678 A | * | 9/2000 | Bishop et al. | 315/209 PZ |
| 6,189,858 B1 | * | 2/2001 | Miyazoe et al. | 251/129.06 |
| 6,488,879 B1 | * | 12/2002 | Moriyasu et al. | 264/255 |
| 7,271,525 B2 | * | 9/2007 | Byers et al. | 310/330 |
| 7,290,993 B2 | * | 11/2007 | Vogeley et al. | 417/413.2 |
| 7,431,574 B2 | * | 10/2008 | Onishi | 417/413.2 |
| 2004/0000843 A1 | * | 1/2004 | East | 310/331 |
| 2004/0021398 A1 | * | 2/2004 | East | 310/311 |
| 2005/0162044 A1 | * | 7/2005 | Sasaki | 310/328 |
| 2005/0189848 A1 | * | 9/2005 | Byers et al. | 310/348 |
| 2005/0225201 A1 | * | 10/2005 | Vogeley | 310/317 |
| 2005/0225202 A1 | * | 10/2005 | Vogeley et al. | 310/317 |
| 2006/0056999 A1 | * | 3/2006 | East | 417/413.2 |
| 2007/0065309 A1 | * | 3/2007 | Nakajima et al. | 417/413.1 |
| 2007/0138914 A1 | * | 6/2007 | Ishikawa et al. | 310/328 |
| 2007/0219480 A1 | * | 9/2007 | Kamen et al. | 604/20 |
| 2008/0063543 A1 | * | 3/2008 | Xu et al. | 417/395 |

* cited by examiner

*Primary Examiner* — Nimeshkumar Patel
*Assistant Examiner* — Thomas A Hollweg
(74) *Attorney, Agent, or Firm* — Apex Juris, pllc; Tracy M Heims

(57) ABSTRACT

An electrical connection structure for use in a micro piezoelectric pump is disclosed. The electrical connection structure includes a driving circuit board and a multilayered wiring structure. The electrical connection structure includes the driving circuit board, the wiring structure, and a piezoelectric element arranged from top to bottom. The driving circuit board is provided with a driving circuit for driving the piezoelectric element and at least an electrical contact, wherein the electrical contacts are electrically connected to the driving circuit. A first electrode contact region and a second electrode contact region electrically insulated from each other are defined on the same surface of the piezoelectric element. The wiring structure sends a signal from the electrical contacts to the first electrode contact region and the second electrode contact region.

20 Claims, 7 Drawing Sheets

WIRING STRUCTURE FOR USE IN MICRO PIEZOELECTRIC PUMP

FIELD OF THE INVENTION

The present invention relates to a micro piezoelectric pump, and more particularly, to a micro piezoelectric pump with a wiring structure therein.

BACKGROUND OF THE INVENTION

Referring to FIG. 1, a driving circuit board 1 and a piezoelectric element 2 of a conventional micro piezoelectric pump are electrically connected to one another by means of two wires 1a. The two ends of each of the wires 1a are soldered to the driving circuit board 1 and the piezoelectric element 2, respectively. When it is desirable that conventional micro piezoelectric pumps be further miniaturized, the wires 1 a are a hindrance to further miniaturization of micro piezoelectric pumps.

The inventor of the present invention found room for improvement in the conventional micro piezoelectric pumps, and thus the inventor devised a wiring structure capable of substituting for the two wires between a driving circuit board and a piezoelectric element and thereby conducive to further miniaturization of micro piezoelectric pumps.

SUMMARY OF THE INVENTION

It is the first objective of the present invention to provide a wiring structure disposed between a driving circuit board and a piezoelectric element for electrical connection therebetween and configured to replace a conventional means of electrical connection between the driving circuit board and the piezoelectric element, namely two wires, so as to facilitate further miniaturization of a micro piezoelectric pump.

The second objective of the present invention is to provide a micro piezoelectric pump that is easy to assemble and spares the need to solder a wire to a piezoelectric element.

To achieve the above objectives, the present invention provides an electrical connection structure for use in a micro piezoelectric pump, as recited in the attached claims.

Also, the present invention further provides a micro piezoelectric pump, as recited in independent claim 15.

BRIEF DESCRIPTION OF THE DRAWINGS

The structure and the technical means adopted by the present invention to achieve the above and other objectives can be best understood by referring to the following detailed description of the preferred embodiments and the accompanying drawings, wherein.

DETAILED DESCRIPTION OF THE INVENTION

Figure 1:
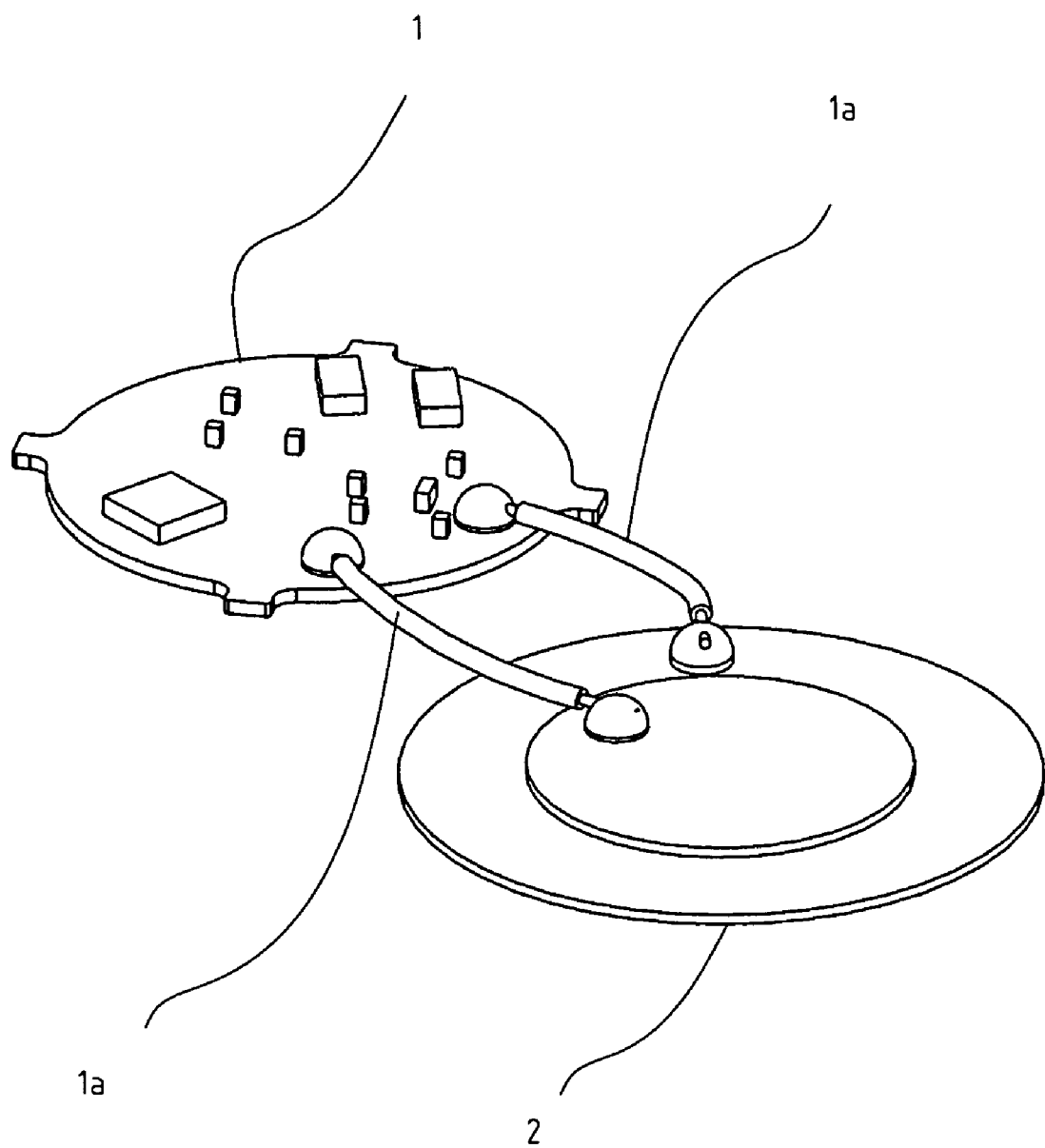
FIG. 1 is a three dimensional schematic diagram showing a driving circuit board and a piezoelectric element connected to one another by two wires as found in a conventional micro piezoelectric pump.
Figure 2:
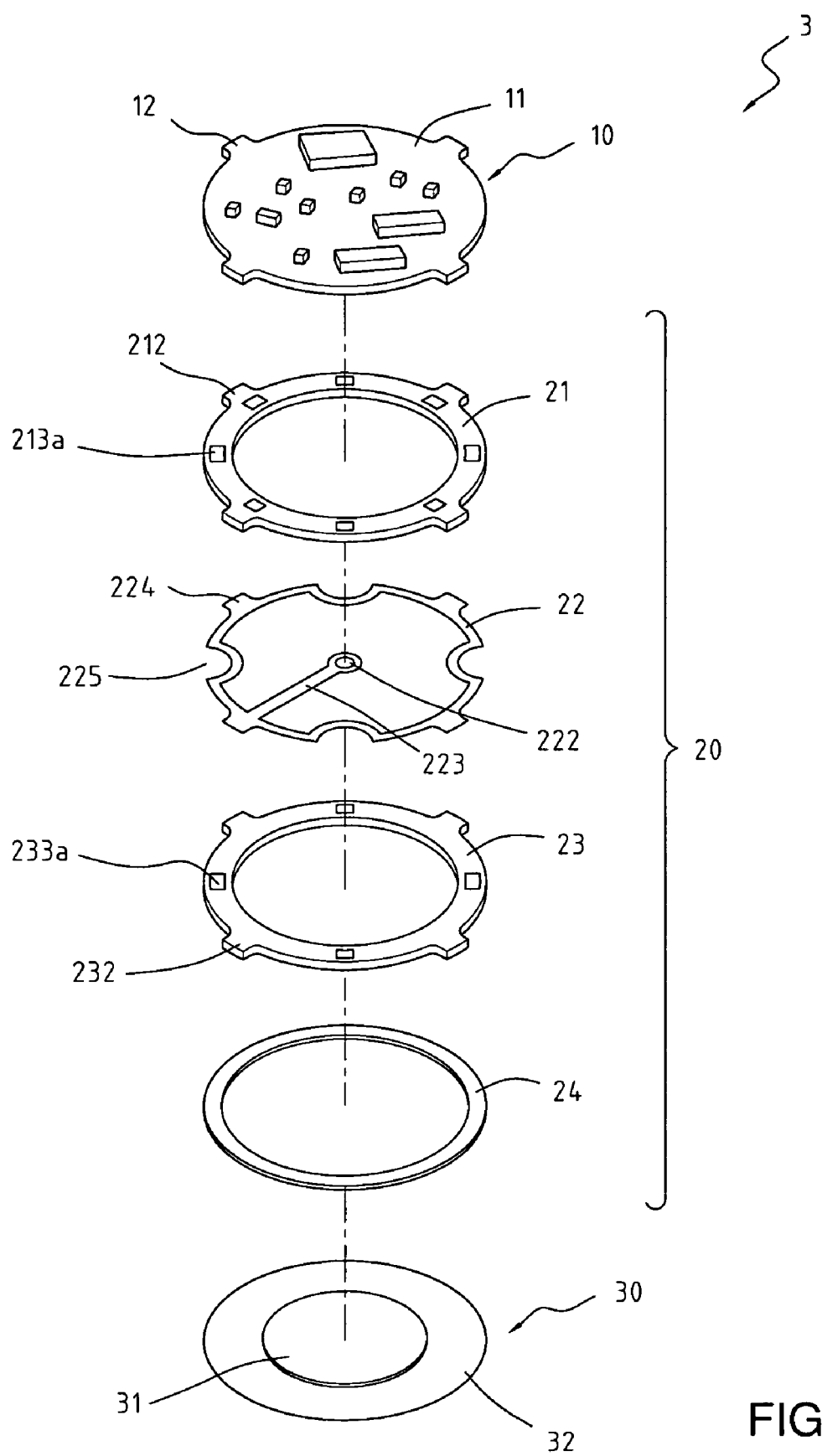
FIG. 2 is a three dimensional exploded view of an electrical connection structure for use in a micro piezoelectric pump of the present invention.
Figure 3:
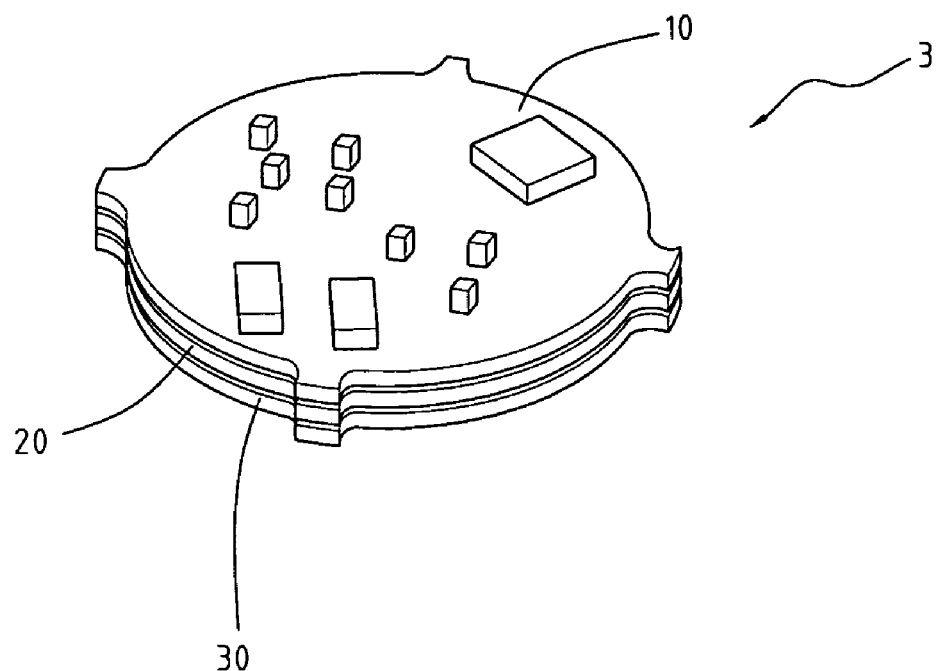
FIG. 3 is a three dimensional view of the assembled electrical connection structure of the present invention.

FIG. 2 is a three dimensional exploded view of an electrical connection structure for use in a micro piezoelectric pump of the present invention. FIG. 3 is a three dimensional view of the assembled electrical connection structure of the present invention. The electrical connection structure 3 of the present invention comprises a driving circuit board 10 and a wiring structure 20, as described in detail hereunder.

Figure 4:
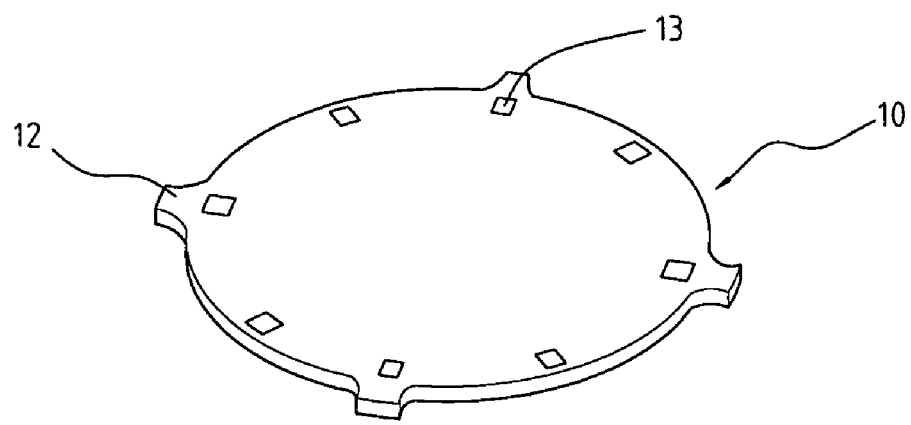
FIG. 4 is a schematic diagram showing the bottom surface of the driving circuit board of the present invention.

The driving circuit board 10 is provided with a driving circuit 11. At least four lugs 12 are formed at the outer rim of the driving circuit board 10. Referring to FIG. 4, a plurality of electrical contacts 13 are formed on the bottom surface of the driving circuit board 10 so as to correspond in position to a plurality of first upper pads 213a formed on a first interface ring 21. The electrical contacts 13 are electrically connected to the driving circuit 11. The driving circuit board 10 is made from printed circuit board (PCB) and has a thickness that ranges between 10 μm and 5 mm.

The wiring structure 20 is multilayered and comprises (from top to bottom) a first interface ring 21, a first metal ring 22, a second interface ring 23, and a second metal ring 24. The multilayered wiring structure 20 consists of individual layers tightly laminated together to form a one-piece structure.

Alternatively, the multilayered wiring structure 20 is tightly laminated to the driving circuit board 10 again so as to form a one-piece structure.

Figure 5:
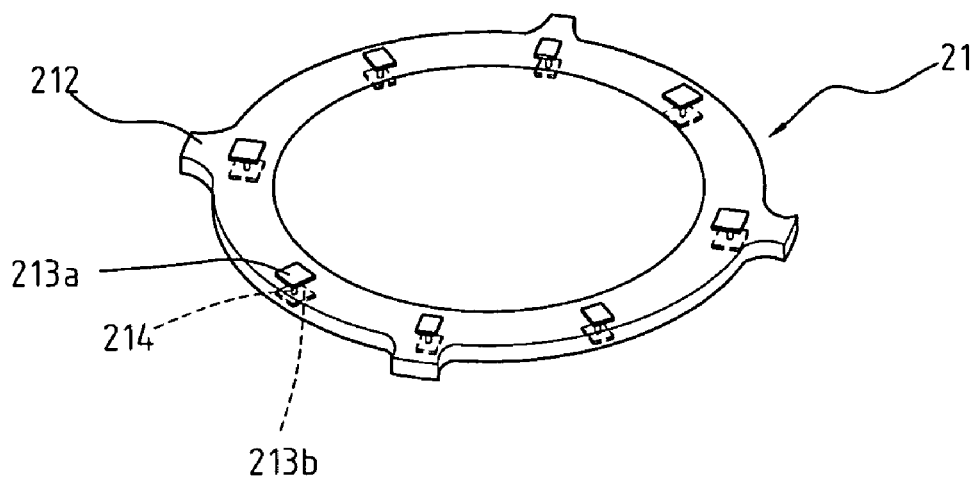
FIG. 5 is a three dimensional perspective view of a first interface ring of the present invention.

The first interface ring 21 is ring-shaped and therefore is centrally hollowed out. The outer rim of the first interface ring 21 is formed with four lugs 21 2 corresponding in position to the lugs 12 of the driving circuit board 10. Referring to FIGS. 2 and 5, at least eight first upper pads 213a and at least eight first lower pads 213b are formed on the top surface and the bottom surface, respectively, of the first interface ring 21. The pads 213a, 213b are made of an electrically conductive material, such as metal. The first upper pads 213a and the first lower pads 213b are paired to be connected by a plurality of conductive penetrating holes 214, respectively. The penetrating holes 214 are configured for electrical conduction. Hence, every pair of said first upper and lower pads 213a, 213b is electrically connected to each other. The quantity of the first upper pads 213a and the first lower pads 213b are not limited to the disclosures of the present invention but can be adjusted as needed. The substrate of the first interface ring 21 is made from a substrate typical of a printed circuit board (PCB), such as FR4 substrate, and has a thickness that ranges between 10 μm and 5 mm.

The first metal ring 22 is ring-shaped and therefore the inner area surrounded by the first metal ring 22 is hollowed out. The first metal ring 22 is formed with a cantilever 223 and a contact 222. The cantilever 223 extends inward, for example, extending centripetally. The contact 222 is formed at the tip of the cantilever 223. The outer rim of the first metal ring 22 is circumferentially formed with four lugs 224 and four dents 225. The lugs 224 correspond in position to the lugs 212 of the first interface ring 21, respectively. The dents 225 channel the four first lower pads 213b of the first interface ring 21, respectively. The first metal ring 22 is made of one selected from the group consisting of nickel, nickel/cobalt alloy, stainless steel, titanium, copper, brass, aluminum, and cobalt, and has a thickness that ranges between 0.1 μm and 500 μm.

Figure 6:
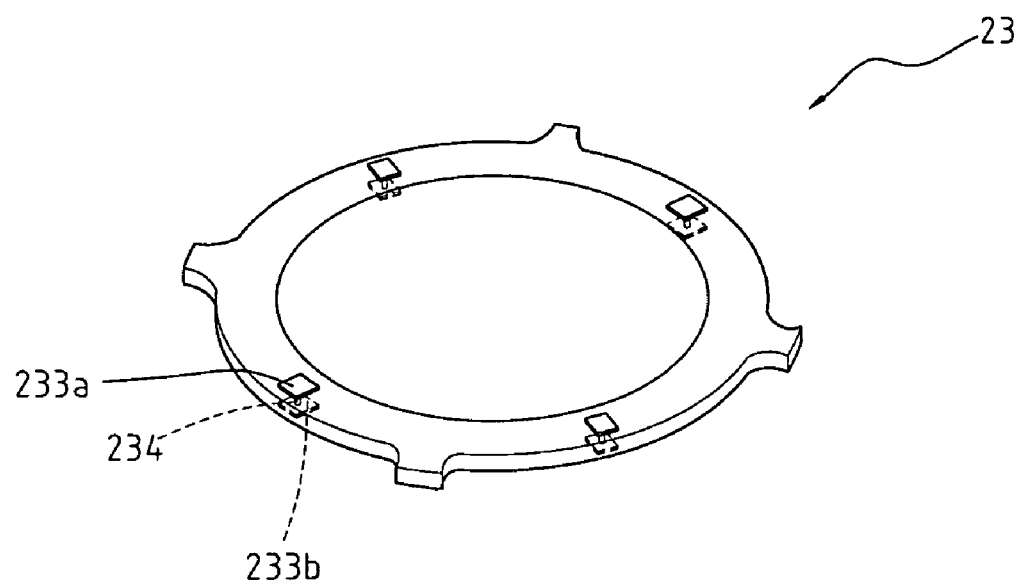
FIG. 6 is a three dimensional perspective view of a second interface ring of the present invention.

The second interface ring 23 is ring-shaped and therefore is centrally hollowed out. The outer rim of the second interface ring 23 is formed with four lugs 232 corresponding in position to the lugs 224 of the first metal ring 22. Referring to FIGS. 2 and 6, at least four first second upper pads 233a and at least four second lower pads 233b are formed on the top surface and the bottom surface, respectively, of the second interface ring 23. The pads 233a, 233b are made of an electrically conductive material, such as metal. The second upper pads 233a and the second lower pads 233b are paired to be connected by a plurality of conductive penetrating holes 234, respectively. The penetrating holes 234 are configured for electrical conduction. Hence, every pair of said second upper and lower pads 233a, 233b is electrically connected to each other. The quantity of the second upper pads 233a and the second lower pads 233b are not limited to the disclosures of the present invention but can be adjusted as needed according to the quantity of the first upper pads 213a and the first lower pads 213b. The second interface ring 23 is made from a substrate typical of a printed circuit board (PCB), such as FR4 substrate, and has a thickness that ranges between 10 μm and 5 mm.

The height of the second upper pads 233a equals the thickness of the first metal ring 22, allowing the second upper pads 233a to be flush with the first metal ring 22 when the first metal ring 22 abuts against the second interface ring 23.

The second metal ring 24 is ring-shaped and therefore the inner area surrounded by the second metal ring 24 is hollowed out. The second metal ring 24 is made of one selected from the group consisting of nickel, nickel/cobalt alloy, stainless steel, titanium, copper, brass, aluminum, and cobalt, and has a thickness that ranges between 0.1 μm and 500 μm.

A first electrode contact region 31 and a second electrode contact region 32 electrically insulated from each other are defined on the same surface of the piezoelectric element 30. The piezoelectric element 30 is made of a piezoelectric material typical of a conventional piezoelectric element. The thickness of the piezoelectric element 30 ranges between 0.1 μm and 5 mm.

A method for assembling the electrical connection structure 3 of the present invention comprises the steps of: disposing the first interface ring 21 on the bottom surface of the driving circuit board 10 so as for the first interface ring 21 to be in contact therewith; disposing the first metal ring 22 on the bottom surface of the first interface ring 21 so as for the first metal ring 22 to be in contact therewith; and disposing the second interface ring 23 on the bottom surface of the first metal ring 22 so as for the second interface ring 23 to be in contact therewith. The first upper pads 213a on the first interface ring 212 are in contact with corresponding ones of the electrical contacts 13. The four first lower pads 213b on the bottom surface of the first interface ring 21 go through the four dents 225 on the outer rim of the first metal ring 22, respectively, so as to touch the corresponding four second upper pads 233a on the surface of the second interface ring 22, respectively. Subsequent steps are: disposing the second metal ring 24 on the bottom surface of the second interface ring 23 so as for the second metal ring 24 to be in contact therewith; and disposing the piezoelectric element 30 on the bottom surface of the second metal ring 24 so as for the piezoelectric element 30 to be in contact therewith. In so doing, the first electrode contact region 31 of the piezoelectric element 30 comes into contact with the contact 222 of the first metal ring 22, and the second electrode contact region 32 of the piezoelectric element 30 comes into contact with the second metal ring 24.

The driving circuit 11 of the driving circuit board 10 generates a driving signal. Then, the driving signal is sent to the first electrode contact region 31 and second electrode contact region 32 of the piezoelectric element 30 via the electrical contacts 13, the pads 213a, 213b of the first interface ring 21, the first metal ring 22 and the contact 222 thereof, the pads 233a, 233b of the second interface ring 23, and the second metal ring 24. Upon receipt of the driving signal from the driving circuit 11, the piezoelectric element 30 acts accordingly.

Figure 7:
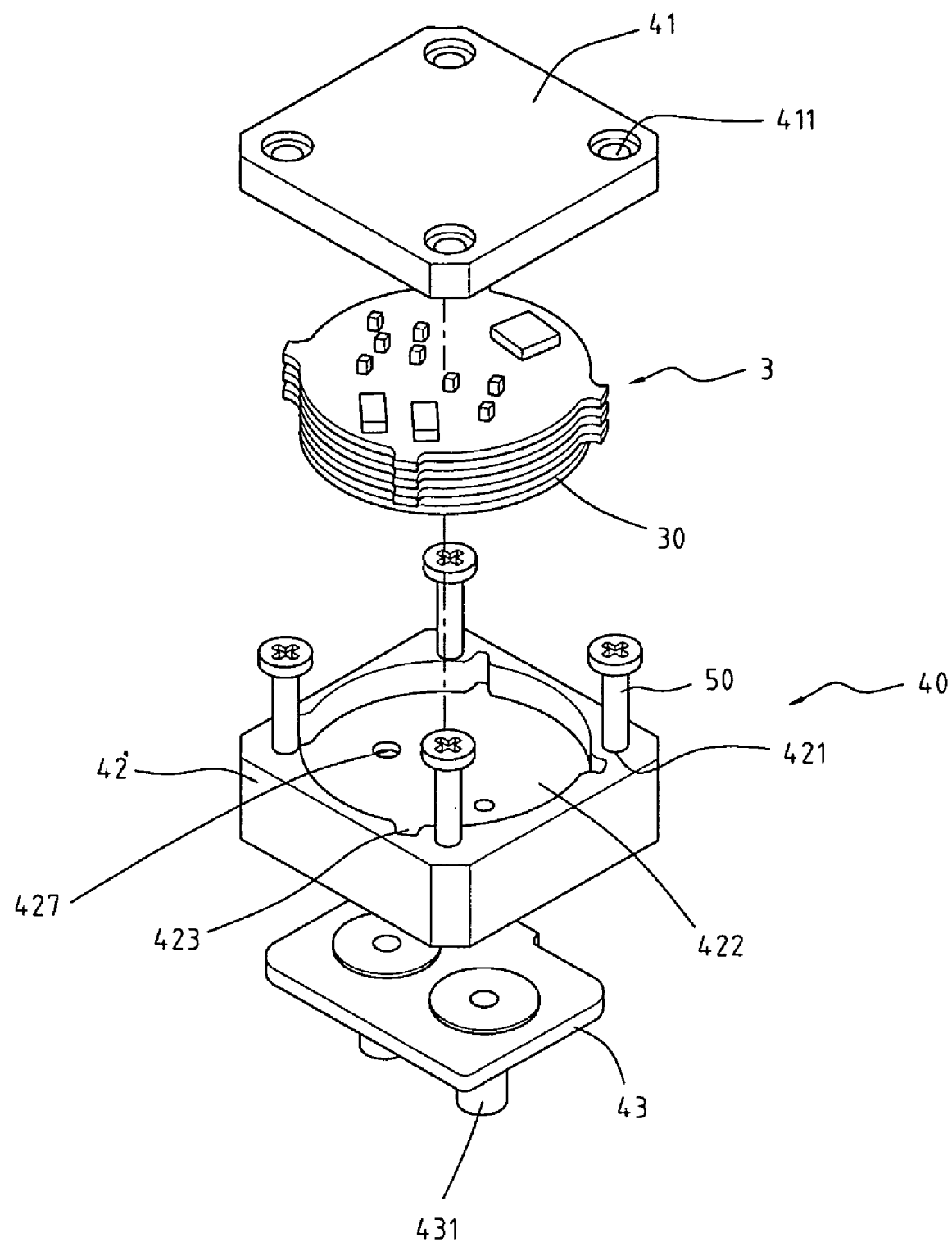
FIG. 7 is a three dimensional exploded view of the micro piezoelectric pump to which the electrical connection structure of the present invention is applicable.
Figure 8:
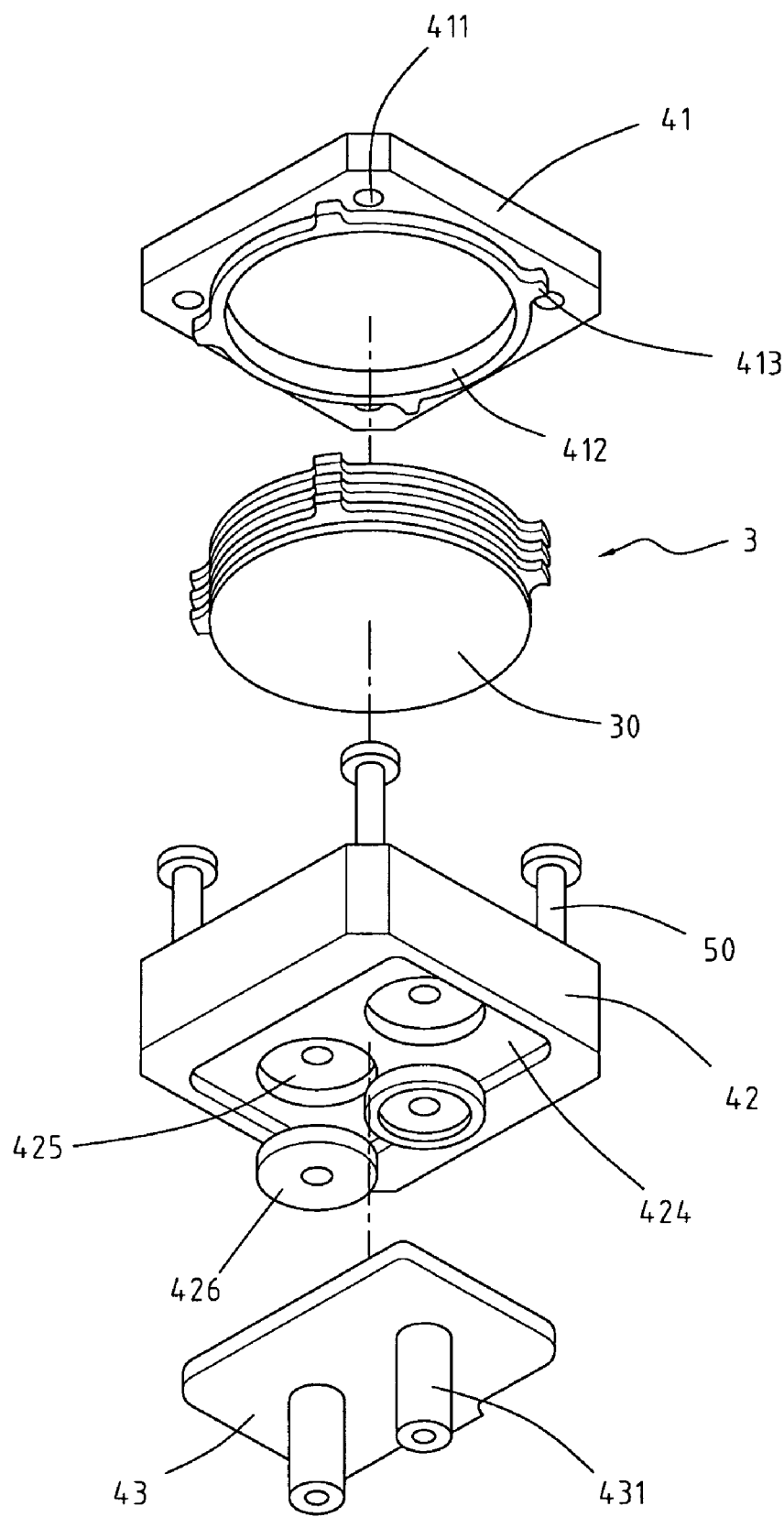
FIG. 8 is a three dimensional exploded view, taken from another viewing angle, showing the micro piezoelectric pump to which the electrical connection structure of the present invention is applicable.
Figure 9:
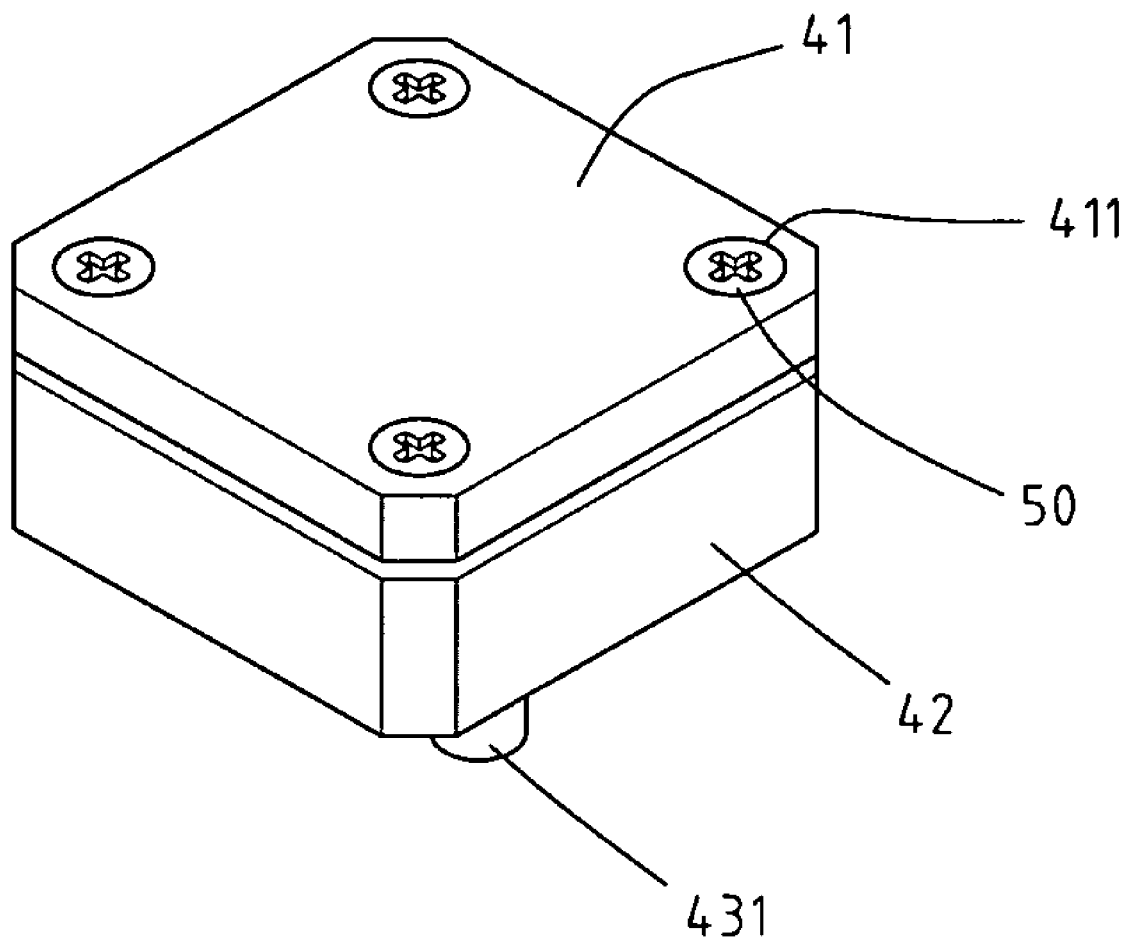
FIG. 9 is a three dimensional view of the micro piezoelectric pump to which the electrical connection structure of the present invention is applicable.

FIG. 7 is a three dimensional exploded view of the micro piezoelectric pump to which the electrical connection structure of the present invention is applicable. FIG. 8 is a three dimensional exploded view, taken from another viewing angle, showing the micro piezoelectric pump to which the electrical connection structure of the present invention is applicable. FIG. 9 is a three dimensional view of the micro piezoelectric pump to which the electrical connection structure of the present invention is applicable. Referring to FIG. 7, the electrical connection structure 3 is configured for use in the micro piezoelectric pump 40 according to the present invention; the micro piezoelectric pump 40 comprises a cover 41, the electrical connection structure 3, the piezoelectric element 30, a body 42, and a bottom plate 43.

Four screw holes 411 are formed at the corners of the cover 41. An annular portion 412 protruding downward is formed on the bottom surface of the cover 41. Four lugs 413 are formed at the periphery of the annular portion 412. The lugs 413 correspond in position to the lugs 12 of the driving circuit board 10, the lugs 21 2 of the first interface ring 21, the lugs 224 of the first metal ring 22, and the lugs 232 of the second interface ring 23.

Four screw holes 421 are formed at the corners of the body 42. The screw holes 421 correspond in position to the screw holes 411 of the cover 41. A recess 422 is formed on the top surface of the body 42. Four lug grooves 423 are formed at the periphery of the recess 422 and are configured to receive the lugs 413, 12, 212, 224, and 232. A recess 424 is formed on the bottom surface of the body 42. Two cavities 425 are formed in the recess 424. Check valves 426 are embedded in the two cavities 425, respectively. Two through holes 427 are formed between the two cavities 425 and the recess 422 of the body 42.

The bottom plate 43 is provided with two pipes 431 corresponding in position to the two cavities 425 in the recess 424 of the body 42.

Regarding the sequence in which steps are performed to assemble the micro piezoelectric pump 40, a method for assembling the micro piezoelectric pump 40 of the present invention comprises the steps of: finalizing assembly of the electrical connection structure 3 described above; aligning the lugs of the electrical connection structure 3 with the corresponding lug grooves 423, respectively; receiving the electrical connection structure 3 and the piezoelectric element 30 in the recess 422 on the top surface of the body 42; covering the recess 422 on the top surface of the body 42 with the cover 41; aligning the screw holes 411 of the cover 41 with the screw holes 421 of the body 42, respectively, thereby allowing the annular portion 412 on the bottom surface of the cover 41 to be abutted against the driving circuit board 10; receiving the two check valves 426 in the cavities 425, respectively; covering the recess 424 on the bottom surface of the body 42 with the bottom plate 43; and screwing a plurality of screwing elements 50 to the screw holes 411, 421, respectively, so as to finalize the assembly of the micro piezoelectric pump 40.

According to the present invention, two wires known in the art are replaced with the wiring structure 20 proposed by the present invention and configured to be disposed between the driving circuit board 10 and the piezoelectric element 30, so as to reduce the internal structures of the micro piezoelectric pump and accomplish miniaturization thereof, which are the advantages and effects of the present invention.

The foregoing specific embodiments are only illustrative of the features and functions of the present invention but are not intended to restrict the scope of the present invention. It is apparent to those skilled in the art that all equivalent modifications and variations made in the foregoing embodiments should fall within the scope of the appended claims.

What is claimed is:

1. An electrical connection structure for use in a micro piezoelectric pump, comprising:
    a driving circuit board provided with a driving circuit for driving a piezoelectric element, and having the driving circuit board provided with at least an electrical contact, wherein the electrical contacts are electrically connected to the driving circuit;
    a first interface ring being a substrate made of an electrically insulated material, having a top surface provided with at least a first upper pad, having a bottom surface provided with at least a first lower pad corresponding in position to the at least a first upper pad, paired said first upper and lower pads being electrically connected to each other, the first interface ring abutting against the bottom surface of the driving circuit board, the first upper pads being in contact with the electrical contacts on the bottom surface of the driving circuit board, wherein the first upper pads and the first lower pads are made of an electrically conductive material;
    a first metal ring circumferentially formed with a plurality of dents corresponding in position to each other, and formed with at least a cantilever extending inward and at least a contact, the contact being provided at the tip of the cantilever, wherein the first metal ring abuts against a bottom surface of the first interface ring so as to be in contact with a portion of the first lower pads of the first interface ring, allowing another portion of the first lower pads to go through the dents;
    a second interface ring being a substrate made of an electrically insulated material, having a top surface provided with at least a second upper pad, having a bottom surface provided with at least a second lower pad corresponding in position to the at least a second upper pad, paired said second upper and lower pads being electrically connected to each other, the second interface ring abutting against the bottom surface of the first metal ring, the second upper pads being in contact with the portion of the first lower pads going through the dents, wherein the second upper pads and the second lower pads are made of an electrically conductive material; and
    a second metal ring abutting against the bottom surface of the second interface ring and being in contact with the second lower pads of the second interface ring; wherein the piezoelectric element has a same surface defined with a first electrode contact region and a second electrode contact region electrically insulated from each other, and abuts against the bottom surface of the second metal ring, the first electrode contact region being in contact with the contact of the first metal ring, and the second electrode contact region being in contact with the second metal ring.

2. The electrical connection structure for use in a micro piezoelectric pump of claim 1, wherein the driving circuit board, the first interface ring, the first metal ring, and the second interface ring are each circumferentially provided with at least four lugs corresponding in position to one another.

3. The electrical connection structure for use in a micro piezoelectric pump of claim 1, wherein the driving circuit board, the first interface ring, or the second interface ring has a thickness between 10 μm and 5 mm.

4. The electrical connection structure for use in a micro piezoelectric pump of claim 1, wherein the first metal ring, the second metal ring, or the piezoelectric element has a thickness between 0.1 μm and 5 mm.

5. The electrical connection structure for use in a micro piezoelectric pump of claim 1, wherein the piezoelectric element is a disk made of a piezoelectric material.

6. The electrical connection structure for use in a micro piezoelectric pump of claim 1, wherein a substrate of the driving circuit board, a substrate of the first interface ring, or a substrate of the second interface ring is a printed circuit board substrate.

7. The electrical connection structure for use in a micro piezoelectric pump of claim 1, wherein the first metal ring or the second metal ring is made of one selected from the group consisting of nickel, nickel/cobalt alloy, stainless steel, titanium, copper, brass, aluminum, and cobalt.

8. The electrical connection structure for use in a micro piezoelectric pump of claim 1, wherein the pads of the first interface ring or the second interface ring are made of metal.

9. The electrical connection structure for use in a micro piezoelectric pump of claim 1, wherein the first interface ring has eight said first upper pads and eight said first lower pads.

10. The electrical connection structure for use in a micro piezoelectric pump of claim 1, wherein the second interface ring has four said second upper pads and four said second lower pads.

11. The electrical connection structure for use in a micro piezoelectric pump of claim 1, wherein the first upper pads and the first lower pads are paired to penetrate a plurality of penetrating holes configured for electrical conduction, allowing every pair of said first upper and low pads to be electrically connected to each other.

12. The electrical connection structure for use in a micro piezoelectric pump of claim 1, wherein the second upper pads and the second lower pads are paired to penetrate a plurality of penetrating holes configured for electrical conduction, allowing every pair of said second upper and low pads to be electrically connected to each other.

13. The electrical connection structure for use in a micro piezoelectric pump of claim 1, wherein the first interface ring, the first metal ring, the second interface ring, and the second metal ring are tightly laminated together to form a one-piece structure.

14. The electrical connection structure for use in a micro piezoelectric pump of claim 1, wherein the driving circuit board, the first interface ring, the first metal ring, the second interface ring, and the second metal ring are tightly laminated together to form a one-piece structure.

15. A micro piezoelectric pump, comprising:
    a body having a top surface and a bottom surface each formed with a recess, wherein the recess on the bottom surface of the body is formed with two cavities, and two check valves are embedded in the two cavities, respectively, allowing two through holes to be formed between the two cavities and the recess on the top surface of the body;

a driving circuit board provided with a driving circuit for driving a piezoelectric element, and having a bottom surface provided with at least an electrical contact, wherein the electrical contacts are electrically connected to the driving circuit, wherein the driving circuit board is disposed in the recess of the top surface of the body;

a wiring structure sandwiched in between the driving circuit board and the piezoelectric element, comprising:

a first interface ring being a substrate made of an electrically insulated material, having a top surface provided with at least a first upper pad, having a bottom surface provided with at least a first lower pad corresponding in position to the at least a first upper pad, paired said first upper and lower pads being electrically connected to each other, the first interface ring abutting against the bottom surface of the driving circuit board, the first upper pads being in contact with the electrical contacts on the bottom surface of the driving circuit board, wherein the first upper pads and the first lower pads are made of an electrically conductive material;

a first metal ring circumferentially formed with a plurality of dents corresponding in position to each other, and formed with at least a cantilever extending centripetally and at least a contact, the contact being provided at the tip of the cantilever, wherein the first metal ring abuts against a bottom surface of the first interface ring so as to be in contact with a portion of the first lower pads of the first interface ring, allowing another portion of the first lower pads to go through the dents;

a second interface ring being a substrate made of an electrically insulated material, having a top surface provided with at least a second upper pad, having a bottom surface provided with at least a second lower pad corresponding in position to the at least a second upper pad, paired said second upper and lower pads being electrically connected to each other, the second interface ring abutting against the bottom surface of the first metal ring, the second upper pads being in contact with the portion of the first lower pads going through the dents, respectively, wherein the second upper pads and the second lower pads are made of an electrically conductive material; and a second metal ring abutting against the bottom surface of the second interface ring and being in contact with the second lower pads of the second interface ring; the piezoelectric element having a same surface defined with a first electrode contact region and a second electrode contact region electrically insulated from each other, and abutting against the bottom surface of the second metal ring, the first electrode contact region being in contact with the contact of the first metal ring, and the second electrode contact region being in contact with the second metal ring;

a cover for covering the recess on the top surface of the body; and a bottom plate provided with two pipes corresponding in position to the two cavities of the body and configured to cover the recess on the bottom surface of the body.

16. The micro piezoelectric pump of claim 15, wherein at least four lugs are protrudingly formed at a periphery of an annular portion on a bottom surface of the cover and circumferentially formed at the first interface ring, the first metal ring, and the second interface ring, respectively, and at least four lug grooves are circumferentially formed at the recess on the top surface of the body.

17. The micro piezoelectric pump of claim 15, wherein the first upper pads and the first lower pads are paired to penetrate a plurality of penetrating holes configured for electrical conduction, allowing every pair of said first upper and low pads to be electrically connected to each other.

18. The micro piezoelectric pump of claim 15, wherein the second upper pads and the second lower pads are paired to penetrate a plurality of penetrating holes configured for electrical conduction, allowing every pair of said second upper and low pads to be electrically connected to each other.

19. The micro piezoelectric pump of claim 15, wherein the first interface ring, the first metal ring, the second interface ring, and the second metal ring are tightly laminated together to form a one-piece structure.

20. The micro piezoelectric pump of claim 15, wherein the driving circuit board, the first interface ring, the first metal ring, the second interface ring, and the second metal ring are tightly laminated together to form a one-piece structure.

* * * * *